(12) United States Patent
Kondo

(10) Patent No.: US 8,228,486 B2
(45) Date of Patent: Jul. 24, 2012

(54) EXPOSING METHOD AND DEVICE MANUFACTURING METHOD

(75) Inventor: Ryoji Kondo, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 349 days.

(21) Appl. No.: 12/706,477

(22) Filed: Feb. 16, 2010

(65) Prior Publication Data

US 2010/0214553 A1 Aug. 26, 2010

(30) Foreign Application Priority Data

Feb. 26, 2009 (JP) ................................. 2009-043352

(51) Int. Cl.
*G03B 27/54* (2006.01)
(52) U.S. Cl. .................................. 355/67; 355/77; 430/5
(58) Field of Classification Search .................... 355/50, 355/53, 67, 71, 77; 430/5, 311
See application file for complete search history.

(56) References Cited

U.S. PATENT DOCUMENTS

| | | | | |
|---|---|---|---|---|
| 7,359,033 B2* | 4/2008 | Yamazoe | ........................ | 355/53 |
| 7,361,454 B2* | 4/2008 | Kobayashi | .................... | 430/313 |
| 7,547,502 B2* | 6/2009 | Kawashima | .................. | 430/311 |
| 7,592,130 B2 | 9/2009 | Kawashima | | |
| 7,824,843 B2* | 11/2010 | Nakao | ............................ | 430/323 |
| 7,947,433 B2* | 5/2011 | Kawashima | .................. | 430/322 |
| 2003/0198872 A1* | 10/2003 | Yamazoe et al. | .................. | 430/5 |
| 2004/0166422 A1* | 8/2004 | Yamazoe et al. | .................. | 430/5 |
| 2007/0092841 A1* | 4/2007 | Kawashima | .................. | 430/311 |
| 2008/0182082 A1* | 7/2008 | Nakao | ........................ | 428/195.1 |
| 2010/0214553 A1* | 8/2010 | Kondo | ............................ | 355/77 |

FOREIGN PATENT DOCUMENTS

JP 2007-109969 4/2007

* cited by examiner

*Primary Examiner* — Thomas R Artman
(74) *Attorney, Agent, or Firm* — Fitzpatrick, Cella, Harper & Scinto

(57) ABSTRACT

In an exposing method which illuminates, by illumination light, a mask having apertures arranged in matrix and a latticed light shielding portion, projects the mask on an object to be projected via a projection optical system, and thus forms a dark portion pattern image at a position conjugate in relation to intersections of a lattice of the light shielding portion, an available light source shape of the illumination satisfies a specific condition. Therefore, it is possible to expose a two-dimensional periodic pattern to a theoretical limit pitch being the same as that of a one-dimensional periodic pattern, and it is also possible to secure a depth of focus sufficiently.

4 Claims, 10 Drawing Sheets

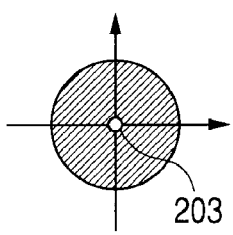
FIG. 4A
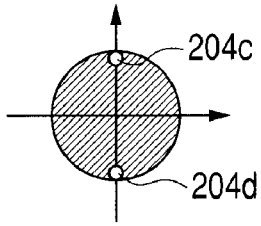
FIG. 4B
FIG. 4C
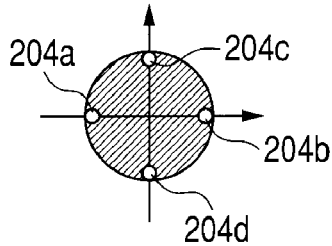
FIG. 4D
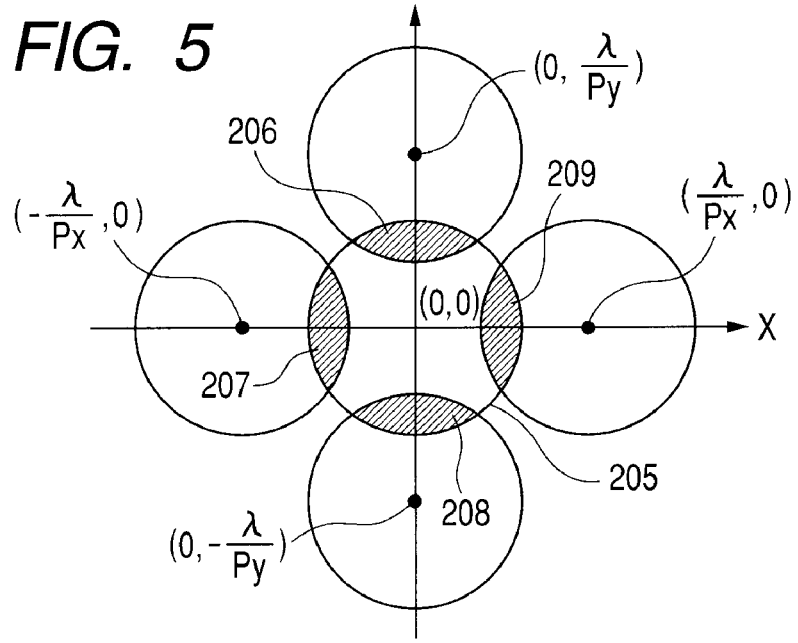
FIG. 5

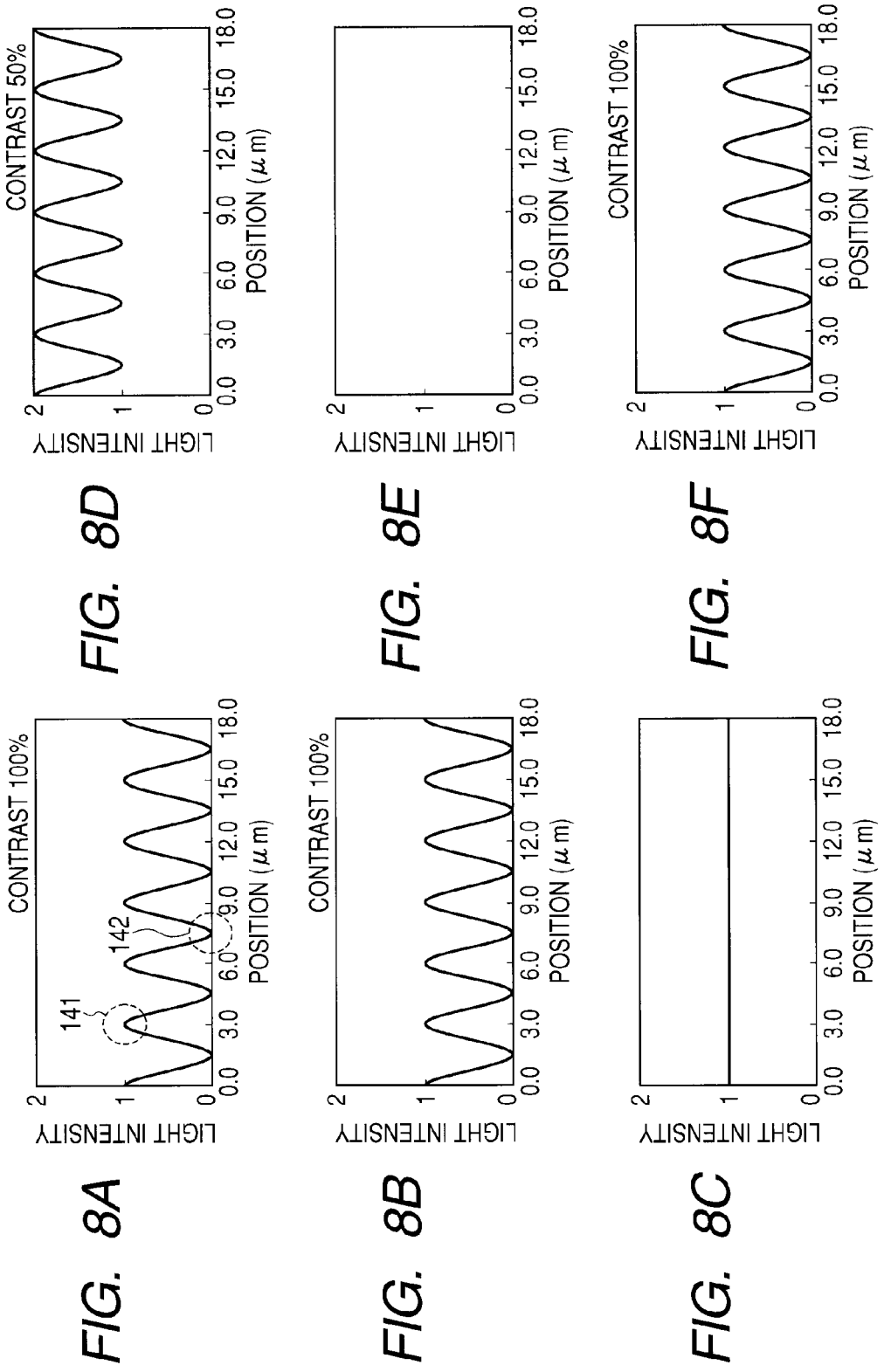

EXPOSING METHOD AND DEVICE MANUFACTURING METHOD

BACKGROUND OF THE INVENTION

1. Field of the Invention

The present invention relates to an exposing method which is used to form various devices used in a semiconductor chip, a displaying device, a detecting device, an imaging device, an electron-emitting device, micromechanics, a photonic crystal, and the like. In particular, the present invention relates to an exposing method which is suitably used as an exposing method of forming a periodic two-dimensional dot pattern to an object to be processed in a photolithography process.

2. Description of the Related Art

A projection exposing apparatus which transfers a pattern by projecting a mask (or reticle) pattern to a wafer via a projection optical system with use of photolithography technique has been conventionally used. Here, a resolution (i.e., a line width of mask) R of the projection exposing apparatus is given by the following Rayleigh expression with use of a wavelength $\lambda$ (m) of a light source and a numerical aperture NA of the projection optical system.

$$R = k_1 \times \lambda / NA \qquad (1)$$

On the other hand, a range of focus capable of maintaining certain image formation performance is called a depth of focus, and the depth of focus DOF is given by the following expression.

$$DOF = k_2 \times \lambda / NA^2 \qquad (2)$$

Here, if the depth of focus DOF becomes small, it becomes difficult to perform focusing, and it is thus required to improve flatness (evenness) of a substrate and focusing accuracy. For this reason, it is basically desirable to enlarge the depth of focus DOF.

In recent years, since it has been requested to make a device minute, a demand for stably resolving a micropattern by the projection exposing apparatus has increased so much more. Here, to achieve stable high-resolution, it is necessary to select optimum exposing conditions (a kind of mask, an illumination condition, and the like) according to a kind of pattern. Further, since it is necessary to enlarge the depth of focus in order to stabilize the image formation performance, the illumination condition affects the depth of focus.

For example, Japanese Patent Application Laid-Open No. 2007-109969 (called a patent document 1 hereinafter) discloses an exposing condition which is optimized in regard to dots or holes having two-dimensional periodicity such as contact holes of a semiconductor device, Spindt-type field emission devices, micromechanics, photonic crystals, and the like. More specifically, the patent document 1 discloses an exposing method which can achieve both resolution and a depth of focus by applying hexa-pole illumination to a mask on which apertures are zigzaggedly arranged.

In the exposing method which obtains a two-dimensional periodic pattern on an object to be exposed, it is generally difficult to obtain resolution as compared with an exposing method which obtains a one-dimensional periodic pattern, because of the following reasons. That is, since it is necessary to capture diffracted light of at least three or more light fluxes on a pupil in order to obtain the two-dimensional periodic pattern, an interval between the respective light fluxes is narrower than that in case of the one-dimensional periodic pattern. In addition, since the number of the light fluxes increases, it is difficult to obtain a contrast on an image surface.

SUMMARY OF THE INVENTION

An object of the present invention is to provide an exposing method which can form a two-dimensional periodic pattern to a theoretical limit pitch which is the same as that of a one-dimensional periodic pattern and further secure a depth of focus sufficiently, and to provide a device manufacturing method in which the relevant exposing method is used.

A first aspect of the present invention is characterized by an exposing method which illuminates, by illumination light, a mask having apertures arranged in matrix and a latticed light shielding portion, projects the mask on an object to be projected via a projection optical system, and thus forms a dark portion pattern image at a position conjugate in relation to intersections of a lattice of the light shielding portion, wherein if it is assumed that, in regard to a center of a pupil of the projection optical system, an X axis extending toward a row direction of the apertures, a Y axis extending toward a column direction of the apertures, and an orthogonal coordinate system having center coordinates of the pupil of the projection optical system as an origin (0, 0) are used, a numerical aperture of the projection optical system is NA, a wavelength of the illumination light is $\lambda$ (m), a row-direction pitch of the apertures is Px (m), and a column-direction pitch of the apertures is Py (m), then an available light source shape of the illumination is provided by overlapping regions of a circle $X^2 + Y^2 = NA^2$ and each of circles defined by $$(X-a)^2 + Y^2 = NA^2,$$

$$(X+a)^2 + Y^2 = NA^2,$$

$$X^2 + (Y-b)^2 = NA^2, \text{ and}$$

$$X^2 + (Y+b)^2 = NA^2, \text{ and}$$

Px, Py, a and b satisfy conditions of $$(\lambda/Px)^2 + (\lambda/Py)^2 > 4NA^2,$$

$$0.25 \cdot \lambda/NA < Px/2 < 0.50 \cdot \lambda/NA,$$

$$0.25 \cdot \lambda/NA < Py/2 < 0.50 \cdot \lambda/NA,$$

$$\lambda/Px \leq a < 2 \cdot NA, \text{ and}$$

$$\lambda/Py \leq b < 2 \cdot NA.$$

The present invention includes the followings as preferable aspects.

That is, the available light source shape of the illumination is provided by a region provided by the overlapping region of the circle $X^2 + Y^2 = NA^2$ and the circle $(X-a)^2 + Y^2 = NA^2$ and a region satisfying $X \leq (\lambda/(2 \cdot Px)) + \alpha)$ and $X \geq (\lambda/(2 \cdot Px) - \alpha)$, a region provided by the overlapping region of the circle $X^2 + Y^2 = NA^2$ and the circle $(X+a)^2 + Y^2 = NA^2$ and a region satisfying $X \geq (-\lambda/(2 \cdot Px) - \alpha)$ and $X \leq (-\lambda/(2 \cdot Px) + \alpha)$, a region provided by the overlapping region of the circle $X^2 + Y^2 = NA^2$ and the circle $X^2 + (Y-b)^2 = NA^2$ and a region satisfying $Y \leq (\lambda/(2 \cdot Py) + \beta)$ and $Y \geq (\lambda/(2 \cdot Py) - \beta)$, and a region provided by the overlapping region of the circle $X^2 + Y^2 = NA^2$ and the circle $X^2 + (Y+b)^2 = NA^2$ and a region satisfying $Y \geq (-\lambda/(2 \cdot Py) - \beta)$ and $Y \leq (-\lambda/(2 \cdot Py) + \beta)$, and Px, Py, a, b, $\alpha$ and $\beta$ satisfy conditions of $$(\lambda/Px)^2 + (\lambda/Py)^2 > 4NA^2,$$

$$0.25 \cdot \lambda/NA < Px/2 < 0.50 \cdot \lambda/NA,$$

$0.25 \cdot \lambda/NA < Py/2 < 0.50 \cdot \lambda/NA,$ $\lambda/Px \leq a < 2 \cdot NA,$ $\lambda/Py \leq b < 2 \cdot NA,$ $0 < \alpha < NA - \lambda/(2 \cdot Px),$ and $0 < \beta < NA - \lambda/(2 \cdot Py).$ Further, P=Px=Py, and $0.25 \cdot \lambda/NA < P/2 < 0.354 \cdot \lambda/NA$ is satisfied.

A second aspect of the present invention is characterized by a device manufacturing method comprising:

an exposing step of exposing an object to be exposed, by the exposing method described as the first aspect of the present invention; and a developing step of developing the object to be exposed, exposed in the exposing step.

According to the exposing method in the present invention, it is possible to form the two-dimensional periodic pattern to the theoretical limit pitch being the same as that of the one-dimensional periodic pattern. Thus, according to the present invention, the minute two-dimensional periodic dot pattern that it was conventionally difficult to manufacture can be stably resolved, and a high-performance device using a two-dimensional periodic structure can be manufactured with high quality.

The above and further features of the present invention will become apparent from the following description of exemplary embodiments with reference to the attached drawings.

BRIEF DESCRIPTION OF THE DRAWINGS

FIGS. 4A, 4B, 4C and 4D are schematic diagrams respectively illustrating the illumination to be used in the exposure indicated in FIGS. 3A to 3C.

FIG. 5 is a schematic diagram for describing an available light source shape to be used in the present invention.

FIGS. 8A, 8B, 8C, 8D, 8E and 8F are diagrams respectively illustrating optical contrasts in an incoherent sum of a two-beam interference fringe.

DESCRIPTION OF THE EMBODIMENTS

An exposing method in the present invention is directed to an exposing method which illuminates, by illumination light, a mask having apertures arranged in matrix and a latticed light shielding portion, projects the mask on an object to be projected via a projection optical system, and thus forms a dark portion pattern image at a position conjugate in relation to intersections of a lattice of the light shielding portion. Here, the present invention is characterized in that an available light source shape of the illumination and the mask are in a specific relation.

Figure 1:
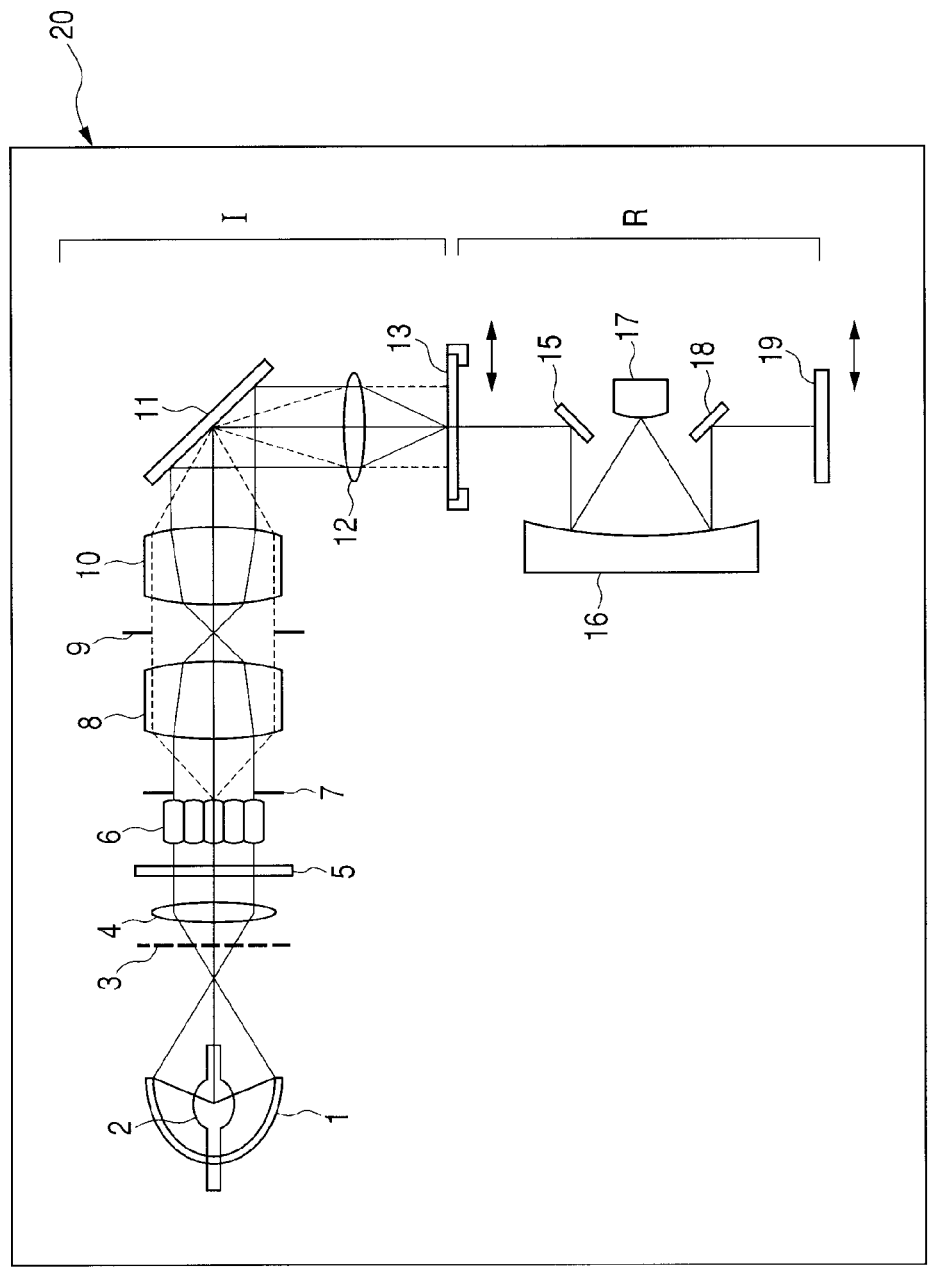
FIG. 1 is a schematic block diagram indicating one aspect of an exposing apparatus which carries out an exposing method according to the present invention.

FIG. 1 is a schematic block diagram indicating one aspect of an exposing apparatus which carries out the exposing method according to the present invention. More specifically, FIG. 1 schematically illustrates a substantial part of a scanning projection exposing apparatus 20 in which an equi-magnification mirror optical system is used. Here, the scanning projection exposing apparatus 20 illustrated in FIG. 1 includes a reflective projection optical system R and an illumination system I. Further, the reflective projection optical system R includes a concave mirror 16, a convex mirror 17, and mirrors 15 and 18. Furthermore, the illumination system I, which includes a relay system (a diaphragm imaging lens system), forms an arc-shaped or fan-shaped illumination region on a mask 13. Here, the relay system includes a mercury-vapor tube light source 2, an elliptical mirror 1, a shutter 3, condenser lenses 4 and 8, a wavelength filter 5, an integrator 6, a diaphragm 7, a field stop 9 having an arc-shaped or fan-shaped aperture, relay lenses 10 and 12, and a mirror 11.

The scanning projection exposing apparatus includes a Köhler illumination system in which a secondary light source surface formed by the integrator 6 substantially coincides with a front focus of the second condenser lens 8 and the field stop 9 substantially coincides with a rear focus of the second condenser lens 9.

The mask 13 is arranged on an object surface of the reflective projection optical system R, and the arranged mask 13 is moved in synchronism with s substrate arranged on an image surface. Light scanning is performed respectively to the mask 13 and the substrate 19 in the directions indicated by the respective arrows of FIG. 1 on the object surface and the image surface, and a pattern formed on the mask 13 is transferred onto the substrate 19.

The illumination system I is requested to illuminate the whole of an image region (usually having an arc shape or a fan shape) of the reflective projection optical system R on the mask 13 uniformly and effectively in a predetermined numerical aperture NA. To achieve such purpose, in the illumination system I, cylindrical fly eye lenses are used as the integrator, illumination light fluxes sent from the respective cylindrical lenses are converged on the field stop 9, and a rectangular illumination region having no illumination unevenness is once formed thereon. Then, the light fluxes which pass through an arc-shaped or fan-shaped slit (aperture) formed on the field stop 9 are imaged on the mask 13 by using a relay system (a diaphragm imaging system) which consists of the relay lenses 10 and 12 and the mirror 11. Thus, the illumination which has a desired arc or fan shape and uniform illuminance at all the points in the illumination region is obtained on the mask 13.

Figure 2A:
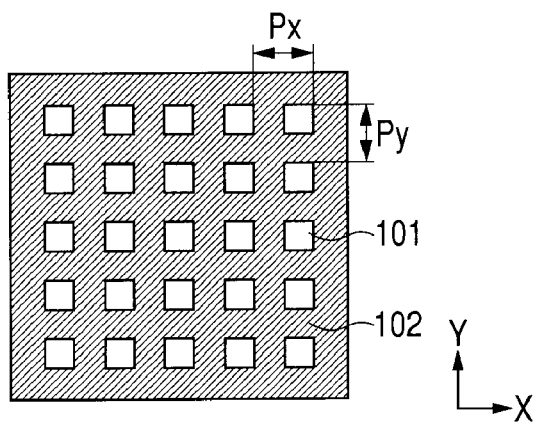
FIGS. 2A and 2B are plan views together indicating an outline of masks according to the present invention.

FIG. 2A is a plan view illustrating the mask 13 of FIG. 1. In FIG. 2A, the mask 13 includes a transmission portion 101 and a light shielding portion 102. Further, in the transmission portion 101, apertures are periodically arranged in X and Y directions, and it is assumed here that a pitch in the X direction is given by Px and a pitch in the Y direction is given by Py. In any case, if an optimum available light source shape is selected in regard to the mask like this, a two-dimensional periodic pattern having high resolution can be formed on the substrate 19. The detail of this pattern will be described hereinafter.

Figure 3A:
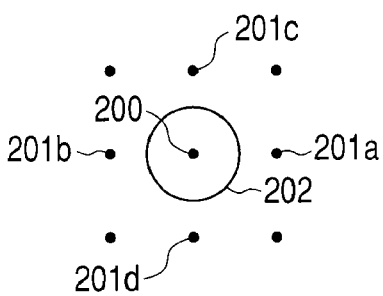
FIGS. 3A, 3B and 3C are schematic diagrams respectively illustrating diffracted light distributions on a pupil in a case where a narrow-pitch two-dimensional periodic pattern is exposed by illumination illustrated in FIGS. 4A to 4D.
Figure 3B:
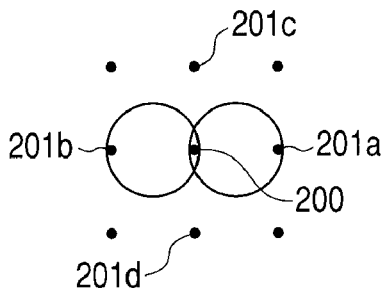

FIG. 3A is a schematic diagram illustrating a diffracted light pattern on a pupil in a case where the mask 13 is illuminated by small σ illumination as illustrated in FIG. 4A. In FIG. 3A, a circle 202 indicates a pupil of the reflective projection optical system R. Incidentally, FIG. 4A is the schematic diagram illustrating a case where NA of the illumination system I is equivalent to NA of the reflective projection optical system R, that is, σ=1.0, and indicating that a point light source 203 of σ=0.0 is arranged at the center of the illumination. If the small σ illumination like this is used, as indicated in FIG. 3A, in regard to zero-order diffracted light 200, primary diffracted light 201a and primary diffracted light 201b are generated according to an X-direction basic period of a mask pattern, and primary diffracted light 201c and primary diffracted light 201d are generated according to a Y-direction basic period of the mask pattern. Here, the positions of the primary diffracted light 201a and the primary diffracted light 201b are given by ±λ/Px if a wavelength of the light source is λ (μm). Likewise, the positions of the primary diffracted light 201c and the primary diffracted light 201d are given by ±λ/Py. For this reason, if the pitches Px and Py become small, that is, if the pattern pitches become narrow, diffracted light intervals become wider. Consequently, since the primary diffracted light does not enter the pupil (circle) 202, any image is not formed on the substrate 19. However, as illustrated in FIG. 4B, if double-pole illumination is performed by using point light sources 204a and 204b, then the X-direction primary diffracted light 201a, the X-direction primary diffracted light 201b and the zero-order diffracted light 200 can enter the pupil all together as indicated in FIG. 3B, whereby an interference fringe can be formed in the longitudinal direction on the substrate 19 by two-beam interference.

Figure 3C:
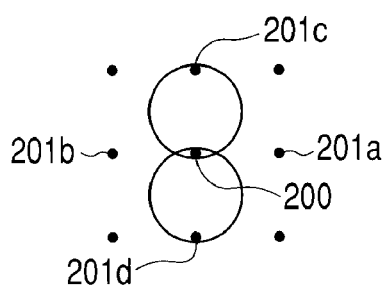

Likewise, as illustrated in FIG. 4C, if double-pole illumination is performed by using point light sources 204c and 204d, then the Y-direction primary diffracted light 201c, the Y-direction primary diffracted light 201d and the zero-order diffracted light 200 can enter the pupil all together as indicated in FIG. 3C, whereby an interference fringe can be formed in the lateral direction on the substrate 19 by two-beam interference.

Besides, if quadri-pole illumination, which is achieved by combining the above-described two kinds of double-pole illuminations, is performed by using the point light sources 204a, 204b, 204c and 204d as illustrated in FIG. 4D, an incoherent intensity sum of the longitudinal-direction interference fringe and the lateral-direction interference fringe is obtained on the image surface, whereby a lattice-like two-dimensional periodic light and dark image is formed.

Since an area of the available light source affects illuminance on the image surface, it is necessary also in the above-described quadri-pole illumination to utilize a maximum illumination area in which an incoherent light and dark image of orthogonal two-beam interferences is formed. The maximum available light source shape by which an effective function can be achieved is as follows.

That is, in regard to the center of the pupil of the projection optical system, an X axis extending toward a row direction of the apertures of the mask, a Y axis extending toward a column direction of the apertures of the mask, and an orthogonal coordinate system having center coordinates of the pupil of the projection optical system as an origin (0, 0) are used. Here, if it is assumed that the numerical aperture of the projection optical system is NA, a wavelength of the illumination light is λ (m), a row-direction pitch of the apertures of the mask is Px (m), and a column-direction pitch of the apertures of the mask is Py (m), then the available light source shape is provided by overlapping regions of a circle indicated by the following expression (3) and each of circles defined by the following expressions (4) to (7).

$$X^2+Y^2=NA^2 \qquad (3)$$

$$(X-a)^2+Y^2=NA^2 \qquad (4)$$

$$(X+a)^2+Y^2=NA^2 \qquad (5)$$

$$X^2+(Y-b)^2=NA^2 \qquad (6)$$

$$X^2+(Y+b)^2=NA^2 \qquad (7)$$

Here, Px, Py, a and b satisfy the following conditions.

$$(\lambda/Px)^2+(\lambda/Py)^2>4NA^2 \qquad (8)$$

$$0.25\cdot\lambda/NA<Px/2<0.50\cdot\lambda/NA \qquad (9)$$

$$0.25\cdot\lambda/NA<Py/2<0.50\cdot\lambda/NA \qquad (10)$$

$$\lambda/Px\leq a<2\cdot NA \qquad (11)$$

$$\lambda/Py\leq b<2\cdot NA \qquad (12)$$

FIG. 5 is a schematic diagram illustrating the available light source shape which satisfies the above-described conditions. That is, a circle 205 indicates the illumination system of NA corresponding to σ=1.0, and regions 206, 207, 208 and 209 which are respectively the overlapping regions of the circle 205 and the four circles obtained by shifting this circle in the X-axis and Y-axis directions constitute the available light source. If the illumination inside the relevant four regions is used, primary light does not enter the pupil, whereby a contrast deteriorates. Each of the shift amounts of the four circles may be larger than the position λ/P of the primary diffracted light in a case where the mask pattern is coherently illuminated, and the shifts amounts a and b of the circles are expressed respectively by the expressions (11) and (12) as indicated above. Incidentally, in the expressions (11) and (12), the upper limits of a and b are the conditions that an available light source area is limited.

Figure 13:
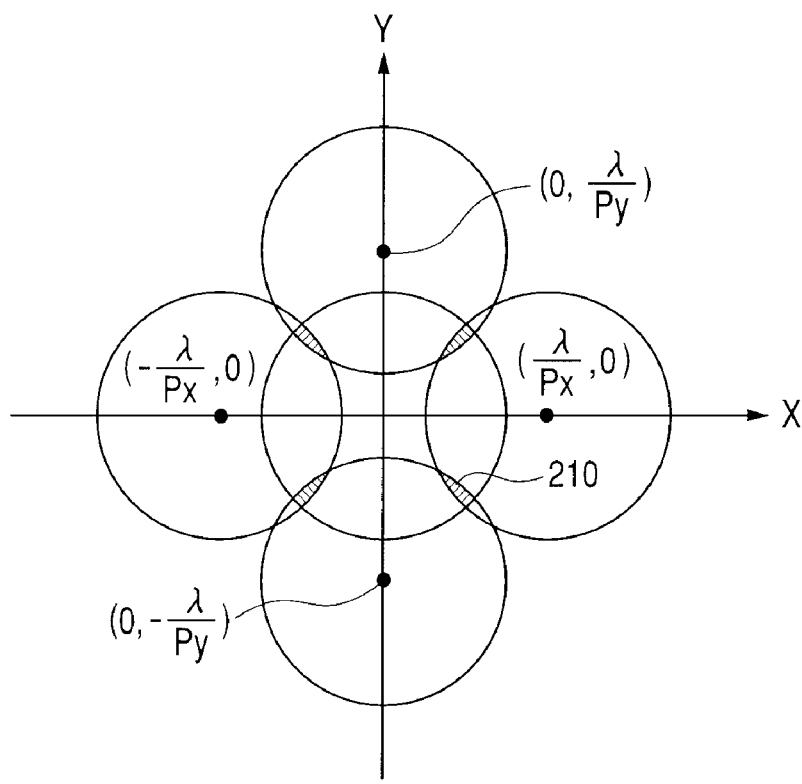
FIG. 13 is a schematic diagram for describing an illumination shape in a case where mask pitches have been widen.

The range which should be satisfied by Px and Py is the condition in which the incoherent sum of the orthogonal two directions of the two-beam interference fringe is achieved. FIG. 13 is a schematic diagram illustrating the illumination shape in a case where Px and Py have been widen. In FIG. 13, it is understood that, unlike FIG. 5, an overlapping region of the three circles occurs. As just described, in the condition that overlapping of circles occurs, since an interference component of three or more light fluxes occurs, an optical contrast on the image surface deteriorates. Consequently, it is necessary to limit Px and Py within a range in which the above overlapping does not occur. Here, the condition in which any overlapping does not occur and which should be satisfied by Px and Py is indicated by the expression (8).

Figure 14:
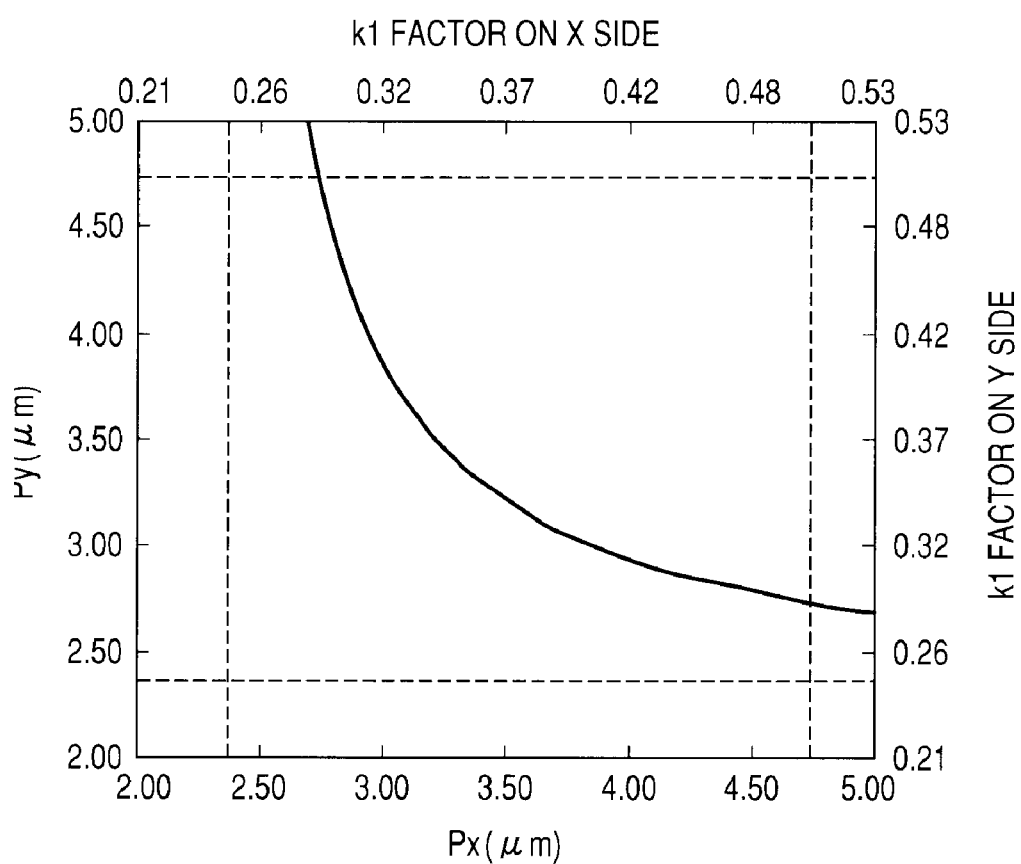
FIG. 14 is a diagram indicating a calculation example of a pattern pitch which should be satisfied in the present invention.

FIG. 14 is a diagram indicating a range in which two-beam interference occurs in exposure of NA=0.083, an exposure wavelength $\lambda$=0.393 (µm), and Px=Py=3.0 (µm), i.e., k1=0.317. Here, the curve illustrated in FIG. 14 is equivalent to the following expression.

$$(\lambda/Px)^2+(\lambda/Py)^2=4NA^2 \quad (13)$$

Further, a region which is below the relevant curve and is enclosed by the broken line indicating k1=0.25 being an imaging limit and the broken line indicating k1=0.50 being an upper limit in which two-beam interference occurs by an interference fringe in only one direction is the range in which the incoherent sum of the orthogonal two directions of the two-beam interference fringe is achieved. Incidentally, since the exposing method in the present embodiment is the exposing method for the two-dimensional periodic pattern, it is usually conceivable that Px and Py are substantially the same. In particular, in a case where Px=Py=P, the following expression is satisfied, whereby it is derived that the pattern of the pitch corresponding to k1=$(1/8)^{1/2}$<0.354 is the relevant range.

$$(\lambda/P)^2>2NA^2 \quad (14)$$

That is, in the case where P=Px=Py, 0.25·$\lambda$/NA<P/2<0.354·$\lambda$/NA.

Further, an optical contrast C is defined as the following expression, from maximum light intensity Imax in a light portion of the image surface and minimum light intensity Imin in a dark portion of the image surface.

$$C=(Imax-Imin)/(Imax+Imin)\times100(\%) \quad (15)$$

In a photolithography process, patterning is necessary for a resist. If an image contrast of a light intensity distribution on the resist surface is not equal to or higher than a certain level, it is impossible to form a resist pattern. Further, the higher the optical contrast is, the more advantageous in the points of verticality of the resist pattern, process stability, and a line width error. Generally, it can be said that the optical contrast of about 70% is requested.

Figure 2B:
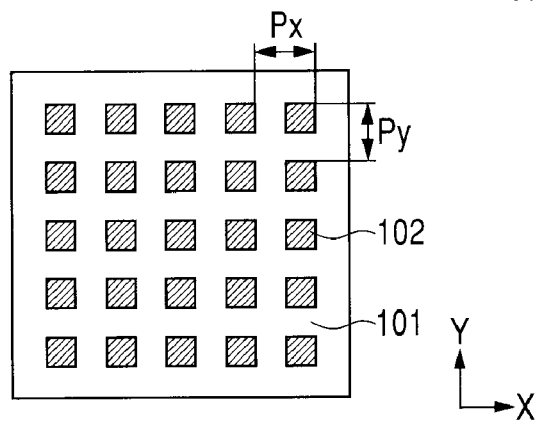

The above-described quadri-pole illumination brings about a desired effect to the pattern in which the apertures are formed on the mask as illustrated in FIG. 2A, but is not suitable for a pattern in which light shielding portions are arranged like dots on the mask as illustrated in FIG. 2B. The detail of such a fact will be described hereinafter.

Figure 6A:
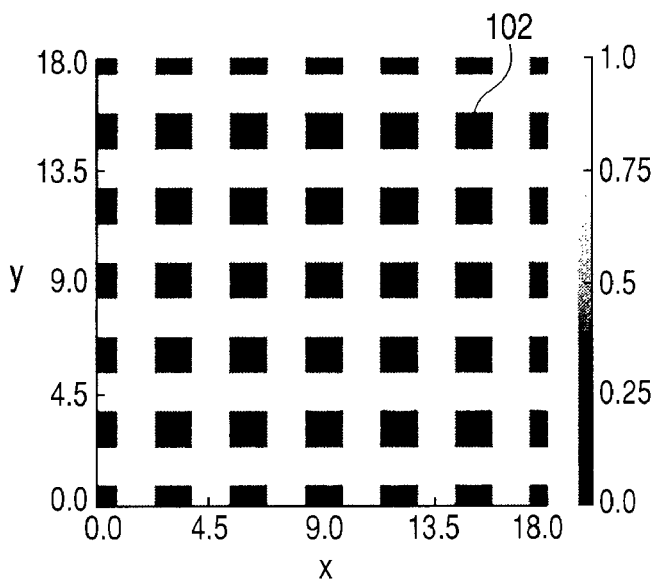
FIG. 6A is a schematic diagram illustrating a mask which is not suitable for the present invention.
Figure 6B:
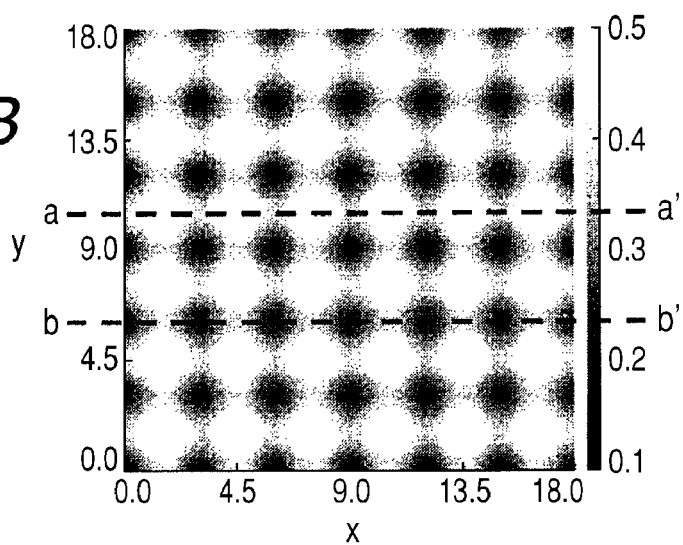
FIG. 6B is a schematic diagram illustrating a two-dimensional light intensity distribution on an image surface in a case where the mask illustrated in FIG. 6A is exposed by illumination indicated in FIG. 11.
Figure 6C:
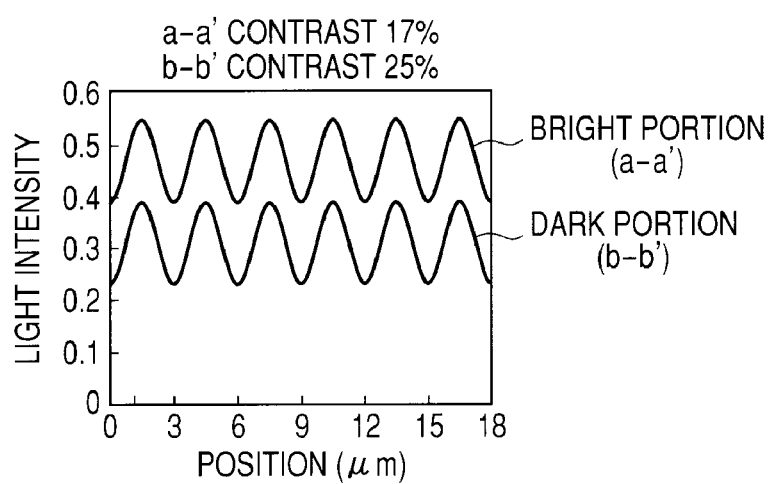
FIG. 6C is a schematic diagram illustrating light intensity distributions at the cross sections a-a' and b-b' in FIG. 6B.
Figure 7A:
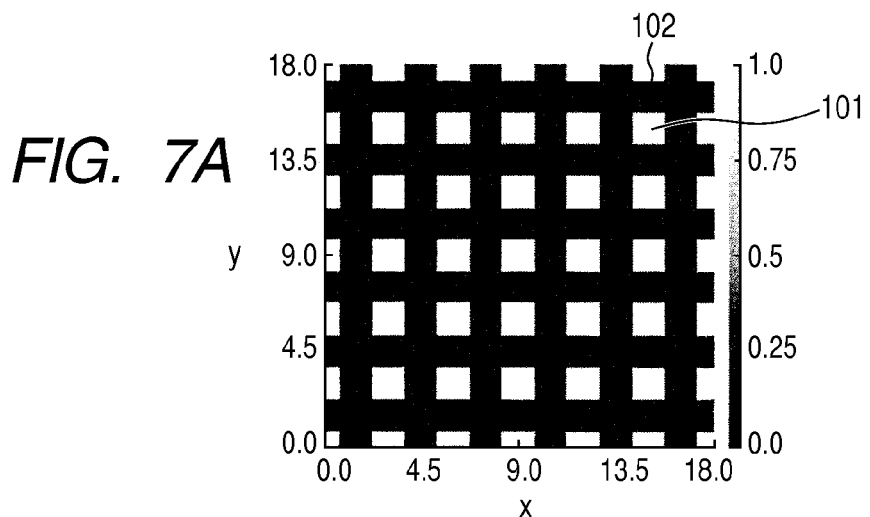
FIG. 7A is a schematic diagram illustrating a mask which is used in the present invention.
Figure 7B:
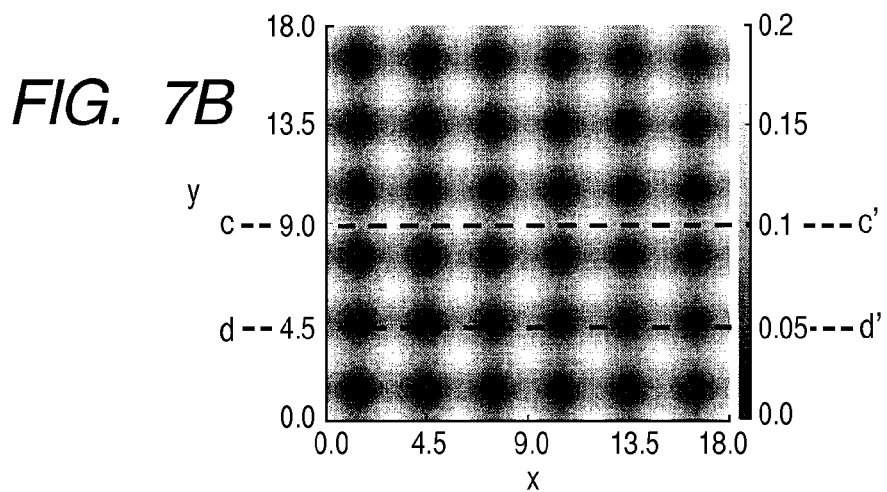
FIG. 7B is a schematic diagram illustrating a two-dimensional light intensity distribution on an image surface in a case where the mask illustrated in FIG. 7A is exposed by the illumination indicated in FIG. 11.
Figure 7C:
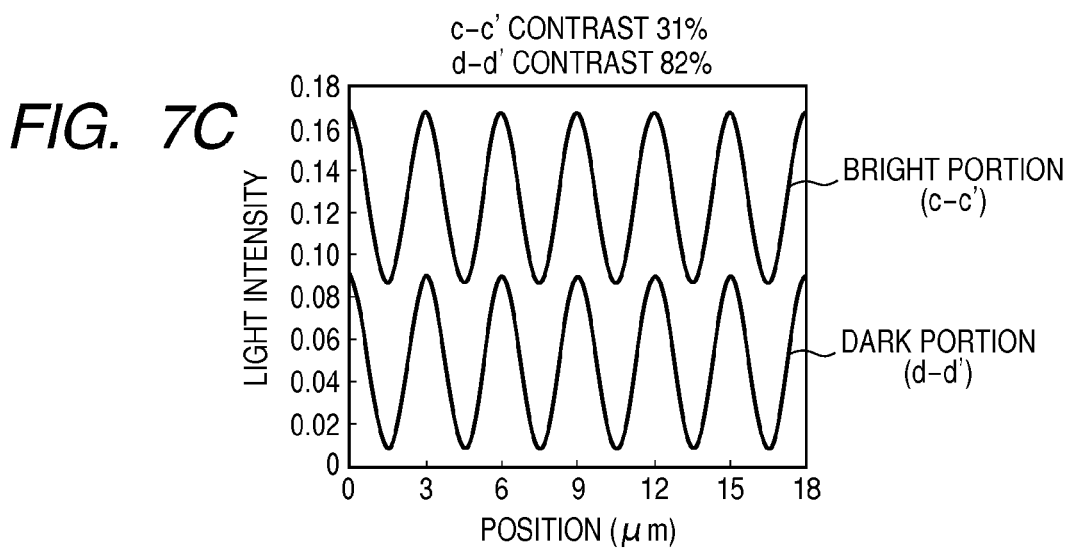
FIG. 7C is a schematic diagram illustrating light intensity distributions at the cross sections c-c' and d-d' in FIG. 7B.

FIGS. 6A to 6C and FIGS. 7A to 7C are diagrams indicating imaging calculation examples in a case where the above-described quadri-pole illumination is applied to the projection optical system corresponding to NA=0.083, the exposure wavelength $\lambda$=0.393 (µm), and Px=Py=3.0 (µm), i.e., k1=0.317. More specifically, FIG. 6B is the image surface light intensity distribution diagram of a pattern (called a leaving pattern hereinafter) in which the light shielding portions 102 are arranged like dots on the mask illustrated in FIG. 6A, and FIG. 6C indicates the light intensity distributions and the relevant optical contrasts at arbitrary cross sections of the image surface. Further, FIG. 7B is the image surface light intensity distribution diagram of a pattern (called a cutting pattern hereinafter) in which the apertures 101 illustrated in FIG. 7A are arranged like holes, and FIG. 7C indicates the light intensity distributions and the relevant optical contrasts at arbitrary cross sections of the image surface.

Even if the above-described quadri-pole illumination is applied to the leaving pattern mask illustrated in FIG. 6A, it is understood that the optical contrast at the cross section a-a' is merely 17% or so and the optical contrast at the cross section b-b' is merely 25% or so as indicated in FIG. 6C. This is because, since the area of the light shielding portions of the mask is small as compared with the area of the transmission potions, diffraction efficiency of the zero-order diffracted light is high, and an intensity ratio between the diffracted lights is large even in the two-beam interference.

Meanwhile, in the cutting pattern mask illustrated in FIG. 7A, the optical contrast at the cross section c-c' which is the image position conjugate in relation to the apertures of the mask remains at 31% or so. However, it is understood that a high contrast image of 82% can be obtained at the cross section d-d' which is the image position conjugate in relation to the intersections of the lattice of the light shielding portions on the mask. Such a phenomenon is simply described with reference to FIGS. 8A to 8F. More specifically, FIGS. 8A to 8F indicate a theoretical limit in a case where the optical contrast of 100% (maximum light intensity 1.0, minimum light intensity 0.0) is obtained in the two-beam interference of the longitudinal and lateral directions. Here, it is assumed that FIG. 8A indicates the image of the longitudinal-direction interference fringe and FIG. 8B indicates the image of the lateral-direction interference fringe. In the image surface, if the two-dimensional image is obtained by the incoherent sum of them, the intensity sum at the image position conjugate in relation to the apertures of the cutting pattern implies adding of the lateral fringe in the orthogonal direction at the position of the maximum value of the longitudinal fringe. Consequently, since the intensity sum is the intensity sum (FIG. 8D) to the lateral fringe to which the optical intensity 1.0 being a peak value 141 of FIG. 8A was added as a bias (FIG. 8C), it is understood that the theoretical optical contrast limit is 50%. On the other hand, the intensity sum at the image position conjugate in relation to the intersections of the light shielding portions of the cutting pattern implies adding of the lateral fringe in the orthogonal direction at the position of the minimum value of the longitudinal fringe. Consequently, since the intensity sum is the intensity sum (FIG. 8F) to the lateral fringe to which the optical intensity 0 being a minimum value 142 of FIG. 8A was added as a bias (FIG. 8E), it is understood that the theoretical optical contrast does not change with 100% as it is.

Incidentally, if a positive type photoresist is used on the side of the substrate, the dot-like leaving pattern is formed on the substrate. On the other hand, if a negative type photoresist is used, the hole-like cutting pattern is obtained.

In the above description, the optical contrast on the best focused surface was explained. In addition, an available light source shape in which a change of contrast is small at the time of defocus will be described hereinafter.

Figure 9A:
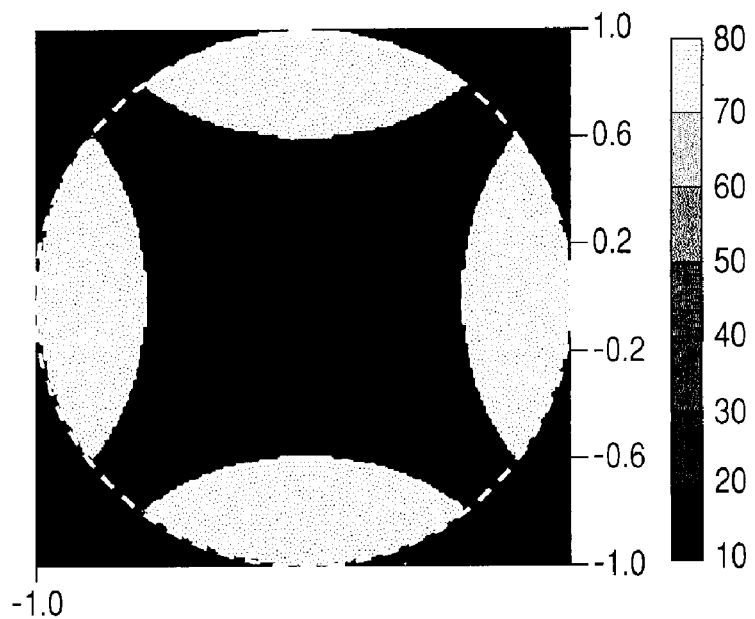
FIGS. 9A and 9B are schematic diagrams respectively illustrating illumination positions and optical contrasts on a best focus surface and a defocus surface.
Figure 9B:
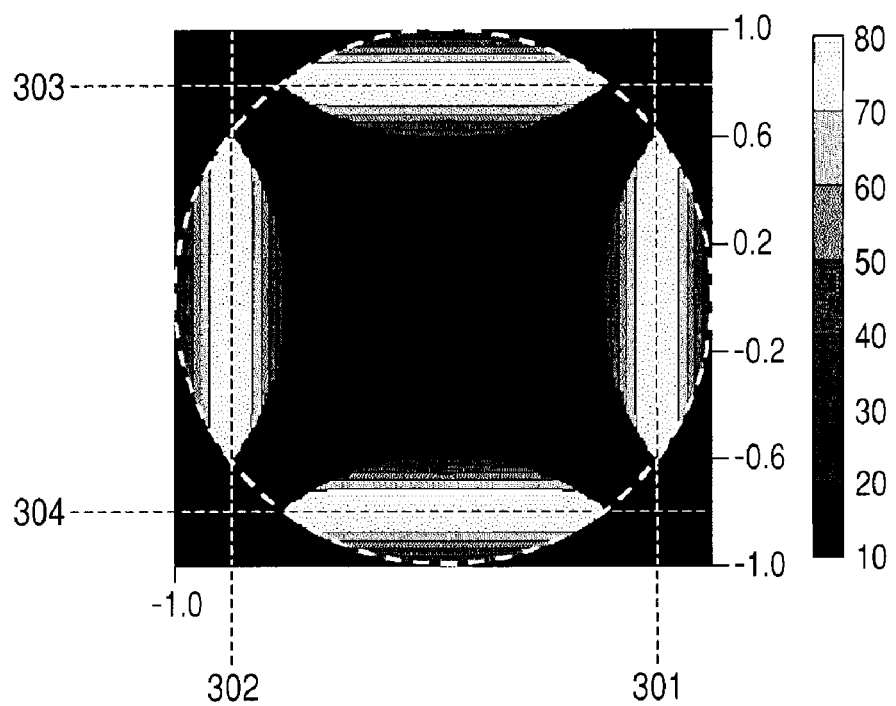
Figure 10:
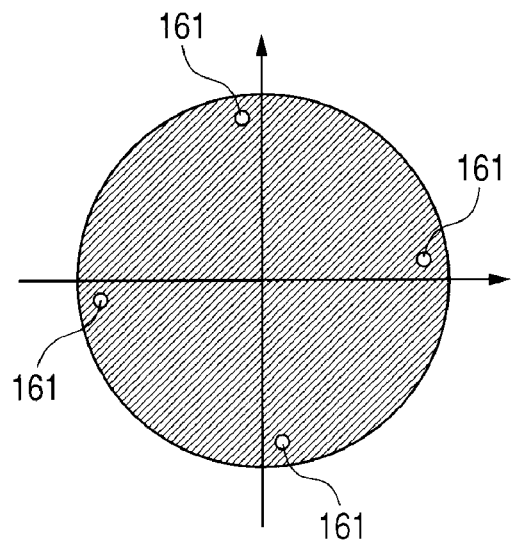
FIG. 10 is a schematic diagram for describing a calculation model in FIGS. 9A and 9B.

FIGS. 9A and 9B are schematic diagrams indicating comparison of the optical contrast at the best focused position (FIG. 9A) and the optical contrast at the position defocused by 30 (µm) (FIG. 9B) in a case where the exposure is performed at the respective illumination positions within the available light source of $\sigma$=1.0 (each of the broken-curve circles illustrated in FIGS. 9A and 9B has a radius NA). Here, it should be noted that the exposing conditions correspond to NA=0.083 of the projection optical system, the exposure wavelength $\lambda$=0.393 (µm), and Px=Py=3.0 (µm), i.e., k1=0.317. Further, in FIGS. 9A and 9B, the local illumination positions and the values of the image surface optical contrasts at the relevant illumination positions are plotted. Such calculations are performed by using minute quadri-pole illumination of four light sources (minute light sources 161) which are quadri-symmetrical in regard to the center of the illumination system, as illustrated in FIG. 10.

At the best focused position as illustrated in FIG. 9A, an optical contrast characteristic within the provided quadri-pole illumination area is substantially uniform. However, it is understood that, at the defocused position as illustrated in FIG. 9B, there are locations where the contrast remarkably deteriorates. In FIG. 9B, the locations having the highest contrast are at the broken lines 301, 302, 303 and 304. Here, the X coordinate of the broken line 301 is given by the following expression.

$$X=\lambda/(2 \cdot Px) \quad (17)$$

Further, the X coordinate of the broken line 302 is given by the following expression.

$$X=-\lambda/(2 \cdot Px) \quad (18)$$

Furthermore, the Y coordinate of the broken line 303 is given by the following expression.

$$Y=\lambda/(2 \cdot Py) \quad (19)$$

Furthermore, the Y coordinate of the broken line 304 is given by the following expression.

$$Y=-\lambda/(2 \cdot PY) \quad (20)$$

This is reasonable if it is considered that wave aberration at the time of defocus is reflected in FIG. 9B. The more line symmetry the zero-order light and the primary light together forming the longitudinal fringe in regard to the Y axis penetrating the center of the pupil are, the less optical path length difference between the respective light fluxes at the time of defocus. Likewise, the more line symmetry the zero-order light and the primary light together forming the lateral fringe in regard to the X axis penetrating the center of the pupil are, the less optical path length difference between the respective light fluxes at the time of defocus.

Consequently, in order to obtain a satisfactory defocus characteristic, it is understood to only have to regulate, by using the broken lines 301 to 304 as the center, the width of the illumination shape and use only the portion where the change of contrast is small.

For this reason, the available light source shave having the satisfactory defocus characteristic is as below.

That is, in regard to the center of the pupil of the projection optical system, the X axis extending toward the row direction of the apertures of the mask, the Y axis extending toward the column direction of the apertures of the mask, and the orthogonal coordinate system having the center coordinates of the pupil of the projection optical system as the origin (0, 0) are used. Here, if it is assumed that the numerical aperture of the projection optical system is NA, the wavelength of the illumination light is λ (m), the row-direction pitch of the apertures of the mask is Px (m), and the column-direction pitch of the apertures is Py (m), then the available light source shape is the region which is provided by the following regions [1] to [4].

[1] the region provided by the overlapping region of the circle $X^2+Y^2=NA^2$ and the circle $(X-a)^2+Y^2=NA^2$ and the region satisfying $X \leq (\lambda/(2 \cdot Px))+\alpha$ and $X \geq (\lambda/(2 \cdot Px))-\alpha$.

[2] the region provided by the overlapping region of the circle $X^2+Y^2=NA^2$ and the circle $(X+a)^2+Y^2=NA^2$ and the region satisfying $X \geq (-\lambda/(2 \cdot Px))-\alpha$ and $X \leq (-\lambda/(2 \cdot Px))+\alpha$.

[3] the region provided by the overlapping region of the circle $X^2+Y^2=NA^2$ and the circle $X^2+(Y-b)^2=NA^2$ and the region satisfying $Y \leq (\lambda/(2 \cdot Py))+\beta$ and $Y \geq (\lambda/(2 \cdot PY))-\beta)$.

[4] the region provided by the overlapping region of the circle $X^2Y^2=NA^2$ and the circle $X^2+(Y+b)^2=NA^2$ and the region satisfying $Y \geq (-\lambda/(2 \cdot Py))-\beta)$ and $Y \leq (-\lambda/(2 \cdot PY))+\beta)$.

Here, Px, Py, a, b, α and β satisfy the following conditions.

$$(\lambda/Px)^2+(\lambda/Py)^2>4NA^2$$

$$0.25 \cdot \lambda/NA < Px/2 < 0.50 \cdot \lambda/NA$$

$$0.25 \cdot \lambda/NA < Py/2 < 0.50 \cdot \lambda/NA$$

$$\lambda/Px \leq a < 2 \cdot NA$$

$$\lambda/Py \leq b < 2 \cdot NA$$

$$0 < \alpha < NA - \lambda/(2 \cdot Px) \quad (21)$$

$$0 < \beta < NA - \lambda/(2 \cdot Py) \quad (22)$$

Figure 11:
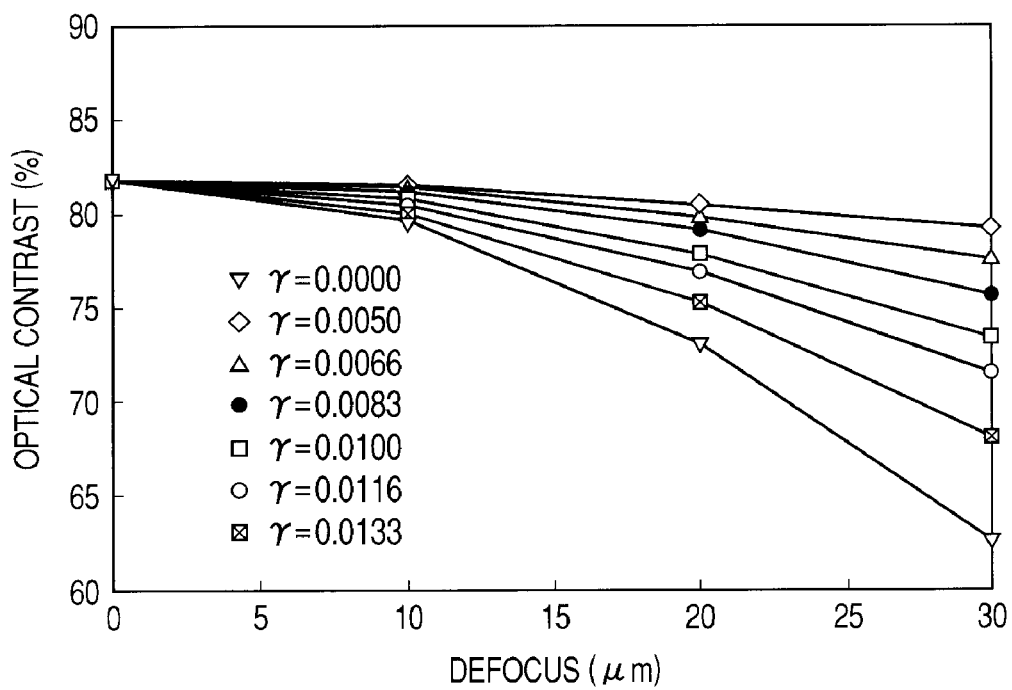
FIG. 11 is a diagram indicating a calculation example using a light source of which the defocus characteristic has been improved.

FIG. 11 indicates simulation results of defocus-improved illumination in the exposure corresponding to NA=0.083 of the projection optical system, the exposure wavelength λ=0.393 (μm), and Px=Py=3.0 (μm), i.e., k1=0.317. In the expressions (21) and (22), α=β (=γ) is set, γ is changed within the range 0≦γ≦0.175, and relation between defocus and the optical contrast is calculated. In the state that defocus is not improved, γ=0.0175 is given. On the other hand, it is understood that, according as γ is reduced to regulate the width, the contrast change is reduced even in defocus.

Subsequently, a device manufacturing method according to the present invention will be described. That is, the device manufacturing method according to the present invention is characterized by comprising an exposing step of exposing an object to be exposed, by the above-described exposing method in the present invention, and a developing step of developing the object to be exposed, exposed in the exposing step.

Figure 12:
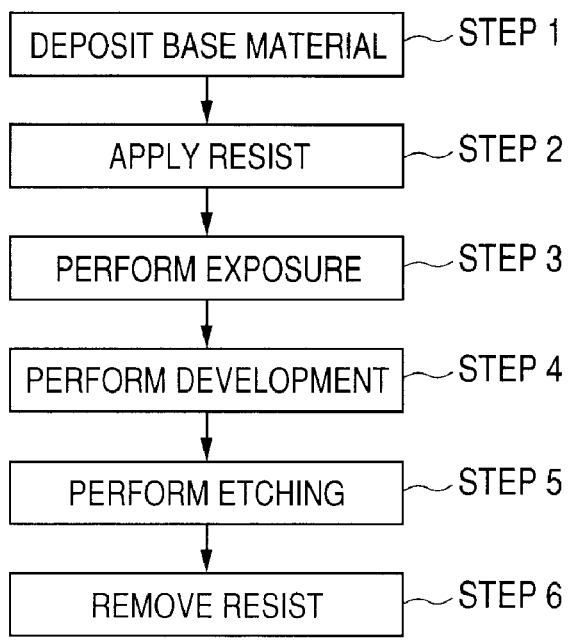
FIG. 12 is a flow chart for describing processes to manufacture a substrate having a two-dimensional periodic structure.

As the device manufacturing method according to the present invention, a manufacturing method, in which the scanning projection exposing apparatus 20 is used, of a substrate having a two-dimensional periodic structure will be described with reference to FIG. 12. FIG. 12 is the flow chart for describing processes to manufacture the substrate having the two-dimensional periodic structure. More specifically, in a step 1, a base material of the two-dimensional periodic structure is deposited on the substrate. In a step 2, a resist is applied on the substrate, and an adequate baking process or the like is performed. In a step 3, the exposure is performed by using the scanning projection exposing apparatus 20 to print the two-dimensional periodic optical image to the resist. In a step 4, the resist is developed. In a step 5, the resist is etched on the mask, whereby the base material deposited on the substrate is processed into the two-dimensional periodic structure. Then, in a step 6, the unnecessary resist is removed. That is, it is possible by the above-described process flow to manufacture the substrate which has the two-dimensional periodic structure. By using the exposing method according to the present invention, the minute two-dimensional periodic dot pattern that it was conventionally difficult to manufacture can be stably resolved, and the high-performance device using the two-dimensional periodic structure can be manufactured with high quality.

While the present invention has been described with reference to what is presently considered to be the exemplary embodiment, it is to be understood that the present invention is not limited to the disclosed embodiment. On the contrary, the present invention is intended to cover various modifications and equivalent arrangements (including the organic combination of respective embodiments) included within the spirit and scope of the appended claims. The scope of the following claims is to be accorded the broadest interpretation so as to encompass all such modifications and equivalent structures and functions.

Although the embodiments have been explained by way of various examples, it is apparent for one of ordinary skill in the art that the purpose and the scope of the present invention are not limited to the specific explanations described in the present application.

This application claims the benefit of Japanese Patent Application No. 2009-043352, filed Feb. 26, 2009, which is hereby incorporated by reference herein in its entirety.

What is claimed is:

1. An exposing method which illuminates, by illumination light, a mask having apertures arranged in matrix and a latticed light shielding portion, projects the mask on an object to be projected via a projection optical system, and thus forms a dark portion pattern image at a position conjugate in relation to intersections of a lattice of the light shielding portion, wherein if it is assumed that, in regard to a center of a pupil of the projection optical system, an X axis extending toward a row direction of the apertures, a Y axis extending toward a column direction of the apertures, and an orthogonal coordinate system having center coordinates of the pupil of the projection optical system as an origin (0, 0) are used, a numerical aperture of the projection optical system is NA, a wavelength of the illumination light is $\lambda$ (m), a row-direction pitch of the apertures is Px (m), and a column-direction pitch of the apertures is Py (m), then an available light source shape of the illumination is provided by overlapping regions of a circle $X^2+Y^2=NA^2$ and each of circles defined by $(X-a)^2+Y^2=NA^2$, $(X+a)^2+Y^2=NA^2$, $X^2+(Y-b)^2=NA^2$, and $X^2+(Y+b)^2=NA^2$, and Px, Py, a and b satisfy conditions of $(\lambda/Px)^2+(\lambda/Py)^2>4NA^2$, $0.25\cdot\lambda/NA<Px/2<0.50\cdot\lambda/NA$, $0.25\cdot\lambda/NA<Py/2<0.50\cdot\lambda/NA$, $\lambda/Px\leq a<2\cdot NA$, and $\lambda/Py\leq b<2\cdot NA$.

2. The exposing method according to claim 1, wherein the available light source shape of the illumination is provided by a region provided by the overlapping region of the circle $X^2+Y^2=NA^2$ and the circle $(X-a)^2+Y^2=NA^2$ and a region satisfying $X\leq(\lambda/(2\cdot Px)+\alpha)$ and $X\geq(\lambda/(2\cdot Px)-\alpha)$, a region provided by the overlapping region of the circle $X^2+Y^2=NA^2$ and the circle $(X+a)^2+Y^2=NA^2$ and a region satisfying $X\leq(-\lambda/(2\cdot Px)-\alpha)$ and $X\geq(-\lambda/(2\cdot Px)+\alpha)$, a region provided by the overlapping region of the circle $X^2+Y^2=NA^2$ and the circle $X^2+(Y-b)^2=NA^2$ and a region satisfying $Y\leq(\lambda/(2\cdot Py)+\beta)$ and $Y\geq(\lambda/(2\cdot Py)-\beta)$, and a region provided by the overlapping region of the circle $X^2+Y^2=NA^2$ and the circle $X^2+(Y+b)^2=NA^2$ and a region satisfying $Y\geq(-\lambda/(2\cdot Py)-\beta)$ and $Y\leq(-\lambda/(2\cdot Py)+\beta)$, and Px, Py, a, b, $\alpha$ and $\beta$ satisfy conditions of $(\lambda/Px)^2+(\lambda/Py)^2>4NA^2$, $0.25\cdot\lambda/NA<Px/2<0.50\cdot\lambda/NA$, $0.25\cdot\lambda/NA<Py/2<0.50\cdot\lambda/NA$, $\lambda/Px\leq a<2\cdot NA$, $\lambda/Py\leq b<2\cdot NA$, $0<\alpha<NA-\lambda/(2\cdot Px)$, and $0<\beta<NA-\lambda/(2\cdot Py)$.

3. The exposing method according to claim 1, wherein P=Px=Py, and
$0.25\cdot\lambda/NA<P/2<0.354\cdot\lambda/NA$ is satisfied.

4. A device manufacturing method comprising:
an exposing step of exposing an object to be exposed, by the exposing method described in claim 1; and
a developing step of developing the object to be exposed, exposed in the exposing step.

* * * * *